(12) United States Patent
Yehezkely et al.

(10) Patent No.: US 11,609,128 B2
(45) Date of Patent: Mar. 21, 2023

(54) SINGLE LAYER LC OSCILLATOR

(71) Applicant: Wiliot, Ltd., Caesarea (IL)

(72) Inventors: Alon Yehezkely, Haifa (IL); Yaron Elboim, Haifa (IL)

(73) Assignee: WILIOT, LTD., Caesarea (IL)

( * ) Notice: Subject to any disclaimer, the term of this patent is extended or adjusted under 35 U.S.C. 154(b) by 364 days.

(21) Appl. No.: 16/708,831

(22) Filed: Dec. 10, 2019

(65) Prior Publication Data

US 2021/0172811 A1     Jun. 10, 2021

(51) Int. Cl.
| | |
|---|---|
| *G01K 7/32* | (2006.01) |
| *G01K 15/00* | (2006.01) |
| *G01K 7/34* | (2006.01) |
| *H03B 5/12* | (2006.01) |

(52) U.S. Cl.
CPC ............ *G01K 15/005* (2013.01); *G01K 7/34* (2013.01); *H03B 5/12* (2013.01)

(58) Field of Classification Search
CPC .......... G01K 15/005; G01K 7/34; H03B 5/12; H03B 5/14; H03B 5/04; H03B 5/1212; H03B 27/00; H03B 2201/00
USPC .......................... 374/117–119, 170, 183–185
See application file for complete search history.

(56) References Cited

U.S. PATENT DOCUMENTS

| | | | | |
|---|---|---|---|---|
| 4,119,845 A | * | 10/1978 | Jaskolski | ........... H03K 17/0824 349/199 |
| 4,922,212 A | * | 5/1990 | Roberts | ............... H03L 1/026 331/158 |
| 6,380,835 B1 | | 4/2002 | Lee | |
| 6,664,863 B1 | * | 12/2003 | Okamoto | ............. H03B 5/1231 257/E23.142 |
| 6,922,128 B2 | | 7/2005 | Vilander et al. | |
| 7,800,457 B2 | | 9/2010 | Unkrich et al. | |
| 8,801,281 B1 | * | 8/2014 | Chan | ......................... G06F 1/20 374/170 |
| 2009/0140383 A1 | | 6/2009 | Chang et al. | |
| 2010/0118501 A1 | * | 5/2010 | Hazucha | ................. H05K 1/165 336/200 |
| 2014/0294042 A1 | * | 10/2014 | Bruset | ...................... G01K 7/32 374/117 |
| 2019/0334477 A1 | | 10/2019 | Xu et al. | |

(Continued)

FOREIGN PATENT DOCUMENTS

| | | | | |
|---|---|---|---|---|
| CA | 1108243 A | * | 9/1981 | ............. G01K 1/024 |
| CA | 2018264 C | | 3/1996 | |
| CN | 100405747 C | * | 7/2008 | |

(Continued)

OTHER PUBLICATIONS

Boutz, Adam. "Inductors in LTCC utilizing full tape thickness features." PhD diss., Kansas State University, 2009. Boutz Adam Dec. 31, 2009 (Dec. 31, 2009) entire document.

(Continued)

*Primary Examiner* — Gail Kaplan Verbitsky
(74) *Attorney, Agent, or Firm* — M&B IP Analysts, LLC

(57) ABSTRACT

An LC oscillator is provided. The LC oscillator includes a single layer inductor disposed within a single layer inlay, wherein the single layer inductor is configured in a spiral pattern within the layer of the inlay, wherein an integrated circuit is mounted on the single layer inlay; and a capacitor included in the integrated circuit, wherein the capacitor is connected to the single layer inductor.

12 Claims, 6 Drawing Sheets

(56) References Cited

U.S. PATENT DOCUMENTS

2019/0372577 A1 * 12/2019 Yehezkely ............ H03L 7/0802

FOREIGN PATENT DOCUMENTS

| CN | 101917070 | A | * | 12/2010 | | |
|---|---|---|---|---|---|---|
| CN | 103684254 | A | * | 3/2014 | | |
| CN | 103715469 | A | * | 4/2014 | ............ | H01M 10/46 |
| CN | 104993794 | A | * | 10/2015 | | |
| CN | 103888079 | B | * | 9/2018 | ............. | H01F 21/12 |
| CN | 108574457 | A | * | 9/2018 | | |
| CN | 109215979 | A | * | 1/2019 | ......... | H01F 17/0006 |
| CN | 111238544 | A | * | 6/2020 | | |
| DE | 10006691 | A1 | * | 8/2001 | ............ | G01B 7/003 |
| DE | 60026846 | T2 | * | 9/2006 | ........ | H01F 17/0006 |
| EP | 2813898 | A1 | * | 12/2014 | ............ | G01N 27/72 |
| JP | S60198700 | A | * | 10/1985 | | |
| JP | 2004336374 | A | * | 11/2004 | | |
| JP | 3730483 | B2 | * | 1/2006 | ......... | H01L 29/0821 |
| JP | 6415285 | B2 | | 10/2018 | | |
| KR | 20140099934 | A | * | 8/2014 | | |
| WO | WO-2010114570 | A1 | * | 10/2010 | ............... | H03H 7/48 |

OTHER PUBLICATIONS

International Search Report and Written Opinion of International Searching Authority for PCT/IB2020/061652, ISA/IL, Jerusalem, Israel dated Mar. 10, 2021.
Reissman, Timothy, Joon-Sik Park, and Ephrahim Garcia. "Multilayer, stacked spiral copper inductors on silicon with micro-Henry inductance using single-level lithography." Active and passive electronic components 2012 (2012). Reissman Timothy Apr. 3, 2012 (Apr. 3, 2012) entire document.

* cited by examiner

SINGLE LAYER LC OSCILLATOR

TECHNICAL FIELD

The present disclosure generally relates to oscillators utilized in low-power transmitters, and more specifically to an inductor-capacitor (LC) oscillator with an inductor implemented within an inlay substrate, and employing such an LC oscillator as a temperature sensor.

BACKGROUND

The Internet of things (IoT) is the inter-networking of physical devices, vehicles, buildings, and other items embedded with electronics, software, sensors, actuators, and network connectivity that enable these objects to collect and exchange data. IoT is expected to offer advanced connectivity to devices, systems, and services that goes beyond machine-to-machine (M2M) communications and covers a variety of protocols, domains, and applications.

Most IoT devices are wireless devices that collect and transmit data to a central controller. There are a few requirements to be met to allow for widespread deployment of IoT devices. Such requirements include reliable communication links, low energy consumption, and low maintenance costs.

To this end, an IoT device and connected wireless sensors are designed to support low power communication protocols, such as Bluetooth low energy (BLE), LoRa, and the like. However, IoT devices utilizing such protocols require a power source, such as a coin battery. The reliance on a battery is a limiting factor for electronic devices due to cost, size, lack of durability from environmental effects, requirement for frequent replacement, and so on. As an alternative to using batteries, power may be harvested and provided from ambient sources, such as light, movement, and electromagnetic power including existing radio frequency waves. In order to minimize power consumption, IoT devices are designed with the minimum required components and may implement low-power consumption oscillators.

FIG. 1 schematically illustrates a standard BLE transmitter 100, which includes a BLE packetizer 110, an oscillator 120, a power source 130, an amplifier 140, and an antenna 150. These components allow for transmission of wireless signals from the BLE transmitter 100 to a receiving device.

The BLE standard defines 40 communication channels in the range of 2.4000 GHz to 2.4835 GHz. Out of these 40 channels, 37 channels are used for communicating data and the last three channels (37, 38, and 39) are used as advertising channels to initialize connections and send broadcast metadata. The BLE standard defines a frequency hopping spread spectrum technique in which the radio hops between channels on each connection event. A broadcaster device may advertise on any one of the 3 advertisement channels. The modulation scheme defined for the BLE standard is a Gaussian frequency shift keying (GFSK) modulation. To this end, within each channel, a frequency deviation greater than 185 KHz above the carrier frequency corresponds to a bit with a binary value of '1' and a frequency deviation less than −185 KHz corresponds to a bit with a binary value of '0'.

The BLE packetizer 110 may receive a signal originated from a processor of a host device. Such a signal may include data or control parameters included in the signal transmitted by the BLE transmitter 100.

The oscillator 120 generates a radio frequency (RF) carrier signal that may carry the data signal generated by the BLE packetizer 110. The modulated RF signal, carrying the data signal, is amplified by the amplifier 140 and then broadcast by the antenna 150. The conventional power source 130 is a battery.

The oscillator 120 may be a free-running oscillator, which may be used to directly generate an RF carrier signal. Thus, a free-running oscillator may replace a frequency synthesizer to generate an RF carrier signal. Utilization of a free-running oscillator may result in power savings. In the BLE transmitter 100, the free-running oscillator generates an RF carrier signal having a frequency within a specific portion of the wireless spectrum, e.g., the 2.4 GHz industrial, scientific, and medical (ISM) wireless spectrum band.

Typically, the oscillator 120, operating as a free running oscillator, is locked via a phase-locked loop (PLL) to a clock originating from a crystal resonator, such as the resonator 121. The resonator 121 may be also included on a board hosting the processor of the IoT device. The resonator 121 is typically a crystal resonator, a quartz resonator, or a microelectromechanical systems (MEMS) based resonator which typically provides a sufficiently accurate and stable time/frequency reference. However, for low-cost, ultra low-power, and small form-factor IoT devices, it is desirable to omit such a resonator.

Further, the energy consumed by oscillators, e.g., for calibration operations, is used mainly from its phase noise requirements or the power required for the onset of oscillation. The power consumption per phase noise requirement decreases proportionally to the quadrature of an oscillator's quality factor.

Oscillators discussed in the related art suffer from a number of limitations, thus are not applicable in a design of IoT tags. For example, crystal oscillators are expensive, relatively large in dimension, and difficult to assemble on low cost inlay substrates. Soldered on oscillators require additional chip (electronic circuity) interfacing pins and require a dedicated substrate design. Integrated RC oscillators are cheaper to manufacture, but consume significantly more power. On-chip inductor-based oscillators pose special metallization and chip area requirements. Inductor-based oscillator have their own limitations, including implementing a compact inductor for smaller devices, since implementing the coils of such an inductor in a limited space is challenging. Accordingly, while employing an integrated oscillator within an IoT device would provide a conveniently low-power oscillator for generating a carrier signal, its physical implementation presents a number of design obstacles.

Furthermore, all of the above-mentioned are typically calibrated, at production, to a specific to nominal frequency used as a reference to the radio. As such, their oscillation frequency is substantially fixed.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "certain embodiments" may be used herein to refer to a single embodiment or multiple embodiments of the disclosure.

Certain embodiments disclosed herein include an inductor-capacitor (LC) oscillator, including: oscillator, comprising: a single layer inductor disposed within a single layer inlay, wherein the single layer inductor is configured in a spiral pattern within the layer of the inlay, wherein an integrated circuit is mounted on the single layer inlay; and a capacitor included in the integrated circuit, wherein the capacitor is connected to the single layer inductor.

Certain embodiments disclosed herein also include an oscillator calibration circuit comprising: a signal frequency detector for producing a reference signal based on a received over-the-air signal, wherein the signal frequency detector is configured to detect a frequency of the over-the-air signal; an inductor-capacitor (LC) oscillator; and a first frequency locking circuit (FLC) coupled to the signal frequency detector and to the LC oscillator, wherein the first FLC calibrates the frequency of the LC oscillator using the reference signal of a radio frequency (RF) carrier frequency, wherein the reference signal is utilized for calibrating the LC oscillator based on the frequency of the detected over-the-air signal.

Certain embodiments disclosed herein also include a temperature sensor, comprising: an inductor-capacitor (LC) oscillator configured with a high quality factor; and a look-up table stored in a memory, wherein the look-up table containing a set of frequencies as a function of temperature values, wherein when the LC oscillator is calibrated to a frequency out of the set of frequencies, the respective temperature as stored in the look-up table is retrieved.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
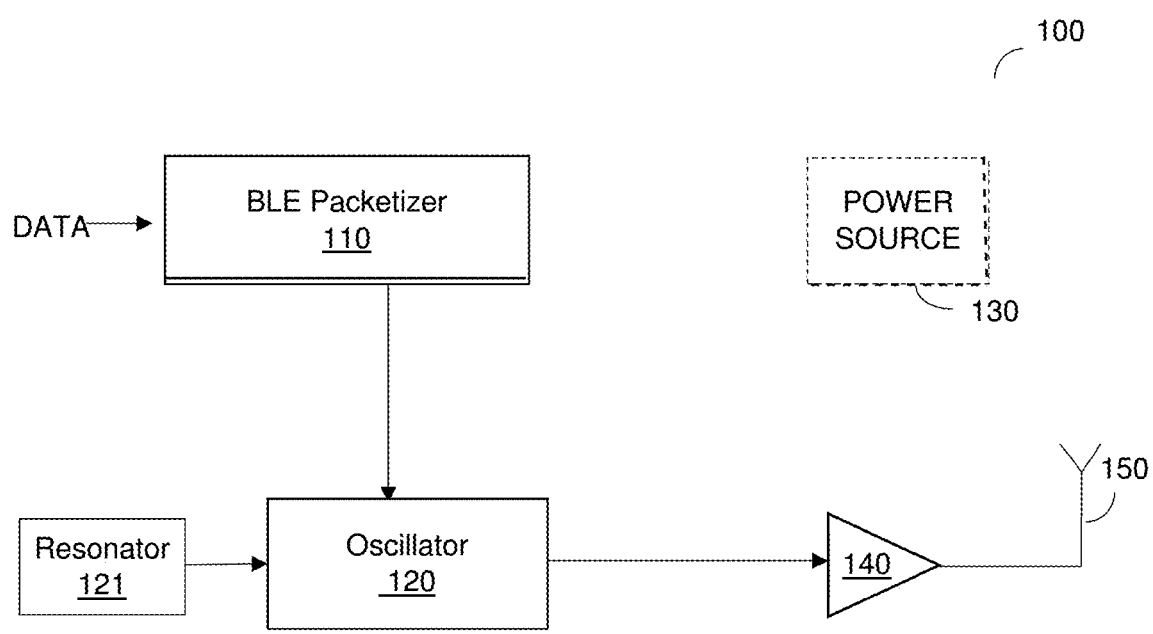
FIG. 1 is a schematic diagram of a BLE transmitter.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

A high quality factor of an oscillator yields smaller active circuitry to generate oscillation due to the reduced power required to compensate for the inductor losses, and hence smaller oscillator frequency sensitivity to temperature variation as the temperature dependence dominance of the active device capacitance can be easily reduced by shunting by a metal capacitor. This can reduce or potentially remove the requirement for calibration due to temperature changes, as smaller circuitry of an oscillator will reduce the effects of changes in ambient temperature.

Figure 2:
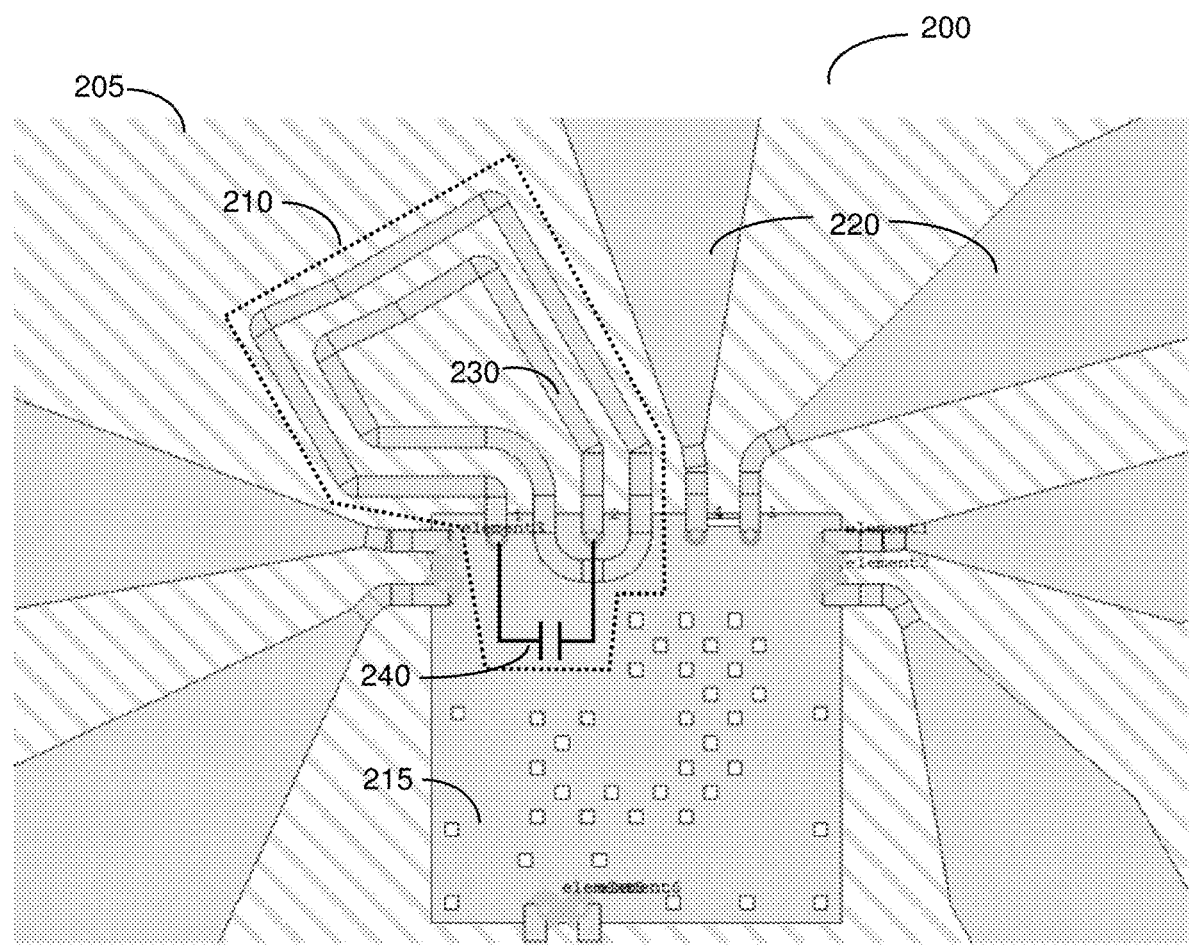
FIG. 2 is a layout diagram of a substrate having an LC oscillator with an inductor implemented within an inlay according to an embodiment.

FIG. 2 is an example layout, or floorplan, diagram of a substrate 205 having an LC oscillator 210 with an inductor 230 implemented within an inlay 200. The LC oscillator 210 is disclosed within a single layer inlay 200. The single layer inlay 200 is an integrated circuit (or chip) 215 connected to at least one antenna 220 and mounted on the substrate 205. The substrate 205 is a single layer material, which may be a single metal layer or any appropriate integrated circuit mounting material, such as a printed circuit board (PCB), silicon, flexible printed circuits (FPC), low temperature co-fired ceramic (LTCC), and the like.

The at least one antenna 220 connected to the chip 215 is configured to transmit and receive radio frequency (RF) signals, including at least BLE signals. In an embodiment, the at least one antenna 220 can be utilized to harvest energy from radio signals at various frequencies, examples of which are provided below. The antennas 220 may be printed on, or etched into, the substrate 205.

The integrated circuit 215, in an embodiment, provides the functionality of a wireless IoT device or tag. The integrated circuit 215 includes a number of execution functions realized as analog circuits, digital circuits, or both. For example, the integrated circuit 215 can perform functions, such as reading from and writing to memory, e.g., of peripherals, and executing simple logic operations; tracking power levels; generating and preparing data packets for transmission; cyclic redundancy check (CRC) code generation; packet whitening; encrypting/decrypting and authentication of packets; converting data from parallel to serial; and staging the packet bits to the analog transmitter path for transmission.

In a preferred embodiment, the integrated circuit 215 includes an oscillator calibration circuit (not shown in FIG. 2) that is coupled, in part, to the LC oscillator 210. The oscillator calibration circuit calibrates the frequency of at least the LC oscillator 210 using an over-the-air reference signal. An example implementation of an oscillator calibration circuit is discussed with reference to FIG. 3.

Typically, an LC oscillator 210 is an electrical resonator for storing energy oscillating at the circuit's resonant frequency. The LC oscillator is realized as an analog circuit having an inductive element and a capacitive element 240 connected together. According to the disclosed embodiment, the inductive element of the LC oscillator 210 is an inductor 230 and the capacitive element is a capacitor 240. The inductor 230 is implemented within the single layer inlay of the substrate 205. The inductor 230 is configured to use the integrated circuit 215 connectivity as a via to generate multiple turns on the single-layered inlay to create an inductor coil. Thus, in an embodiment, the inductor 230 can be structured in a spiral pattern, which allows multiple windings without leaving the single layer of the inlay. It should be appreciated that implementing the inductor 230 with multiple turns on the single layered inlay allows for a reduction of area required by the inductor 230 to free more inlay area for use by the antenna(s) 220 as well as to have more confined magnetic fields that ensure minimal coupling to an adjacent antenna 220 structures and less sensitivity to external materials in proximity. The multi-turn inductor 230 further allows a boost in the inductor's quality factor.

In an embodiment, the capacitor 240 can be a dedicated capacitor included in the chip 215 and connected to the single layer inductor 230. In an embodiment, the capacitor is a configurable low temperature-sensitivity capacitor. In another embodiment, the capacitor 240 is realized as the parasitic capacitance of various circuits (not shown) included in the chip 215. Parasitic capacitance is an unavoidable capacitance that exists between the parts of an electronic component or circuit simply because of their proximity to each other. This capacitance can be captured and used as a capacitor 240 for the LC oscillator 210. In an embodiment, the LC oscillator 210 is configured to have a high quality (Q) factor, which is a value describing how underdamped an oscillator is. An oscillator with a high Q factor offers high temperature stability, which allows the LC oscillator to be calibrated based on ambient temperature value, as further discussed below in FIGS. 4 and 5.

An inlay-based inductor provides a Q factor which is significantly higher than that of an integrated (in-chip) inductor. Additionally, because of the minimal space requirements of an inlay-based inductor, it requires minimal area use on a chip, and is more cost effective. In an embodiment, the frequency of the LC oscillator 210 is calibrated based on a determined ambient temperature.

Figure 3:
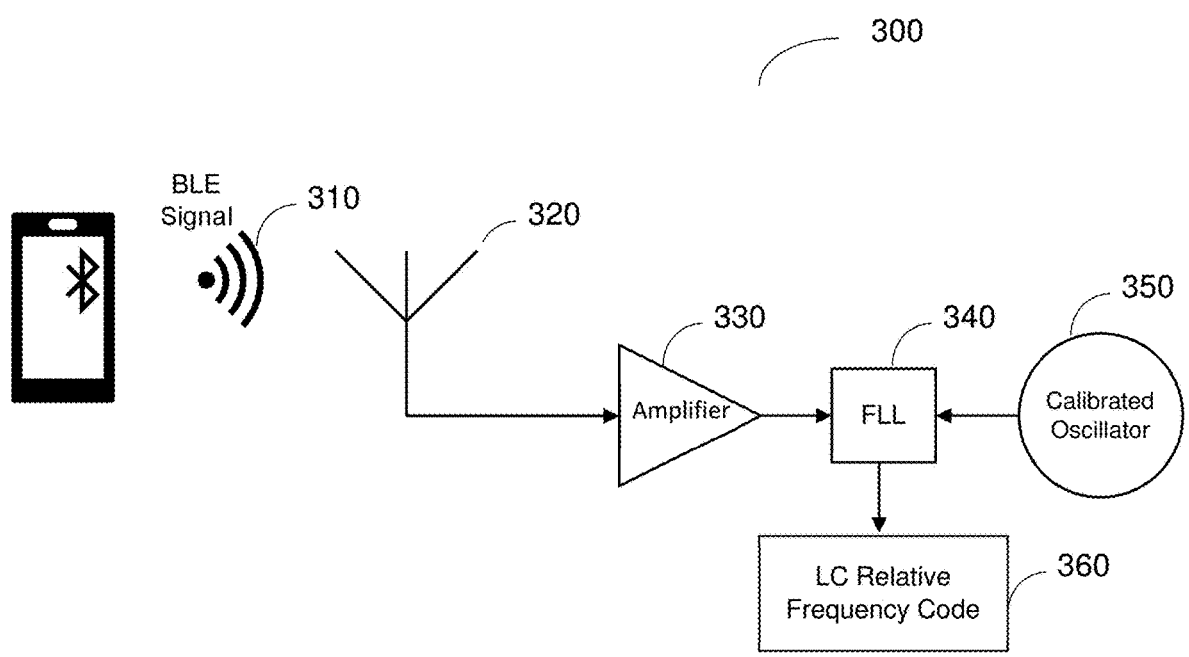
FIG. 3 is a block diagram of a system for determining an LC relative frequency code based to a received over-the-air signal according to an embodiment.

FIG. 3 is an example block diagram of a system 300 for determining an oscillator relative frequency code based to a received wireless signal 310.

A wireless signal 310, such as a BLE or similar RF signal, is received, e.g., by an antenna 320. The received signal 310 is optionally amplified by an amplifier 330 to ensure a sufficiently strong signal, and then fed to a frequency-locked loop (FLL) 340 which is configured for a frequency measurement mode, i.e., with no feedback loop. An oscillator 350 output, such as from an LC oscillator, is compared to the received signal 310 via the FLL 340, which is then output as an LC relative frequency code. The output code is determined based on both the received wireless signal 310 and the LC oscillator 350 signal. The LC relative frequency code represents a derived frequency of the LC oscillator from its proportion to a known received signal frequency. For example, the signal received is at 2.402 GHz (BLE channel 37), and the LC free running is at 3.3 GHz and divided by 3000 to generate a 1.1 MHZ clock. After averaging of several cycles of counting 2.402 GHz with this 1.1 MHZ clock, a result of 2402/1.1=2183.64 represents the ratio between the clocks and indicates that the LC is oscillator is running at 3.3 GHz. In an embodiment, the LC oscillator is calibrated based on an ambient temperature, values in the look-up table and a previously determined and calibrated LC relative frequency. The ambient temperature may be determined based on the LC relative frequency code.

Figure 4:
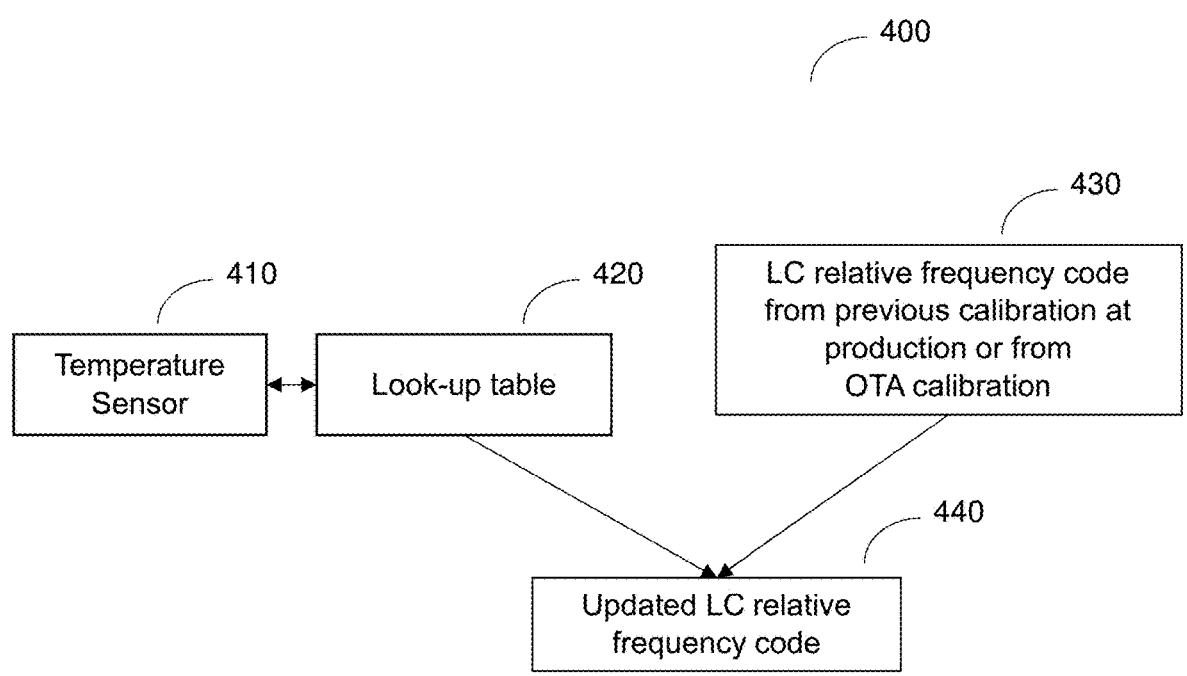
FIG. 4 is a schematic diagram of a system for determining an updated LC relative frequency code of an LC oscillator as function of temperature according to embodiment.

FIG. 4 is an example diagram demonstrating the determination of an updated LC relative frequency code 440 of an LC oscillator based on the measured ambient temperature.

Figure 5:
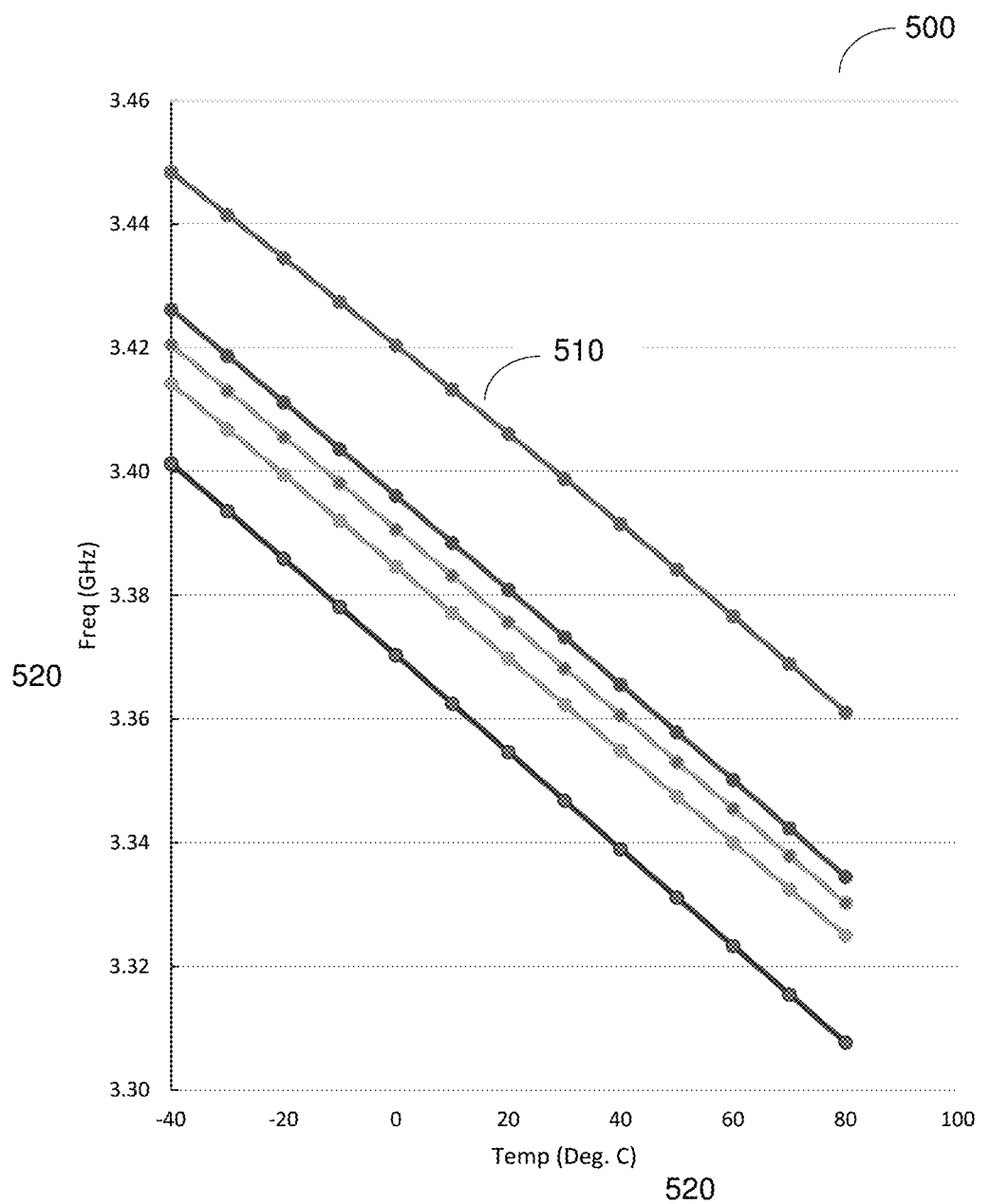
FIG. 5 is a graph showing plots of frequencies as a function of ambient temperatures for multiple oscillators representing extremes of manufacturing variations.

In this embodiment, a temperature sensor 410 measures an ambient temperature of an LC oscillator 405. The LC oscillator 405 is structured and integrated within an IoT tag as discussed in FIG. 2. A look-up table 420 may then be accessed, which provides at least one set of frequencies and temperature values, where each frequency corresponds to a set temperature. The look-up table may be predetermined during the manufacture of the LC oscillator or the IoT tag. In an embodiment, the look-up table 420 may be saved in a retention memory in the chip 215. FIG. 5 demonstrates a graph showing a set of frequencies as a function of temperature values that may be included in the look-up table 420.

An LC relative frequency code 440 is determined based on both the look-up table 420 frequency value associated with a currently detected ambient temperature, and on a previously determined and calibrated LC relative frequency code 430. Such a frequency code 430 may be initially determined during manufacture, and subsequently updated according to the disclosed method. In an embodiment, the difference between a current LC relative frequency code 440 and a previously determined LC relative frequency code 430 is stored, e.g., in a storage of future reference, and may be used to predict future LC relative frequency codes.

This removes or significantly reduces the need for LC oscillator calibration using over-the-air reference signals. The high temperature stability of a high Q factor oscillator allows for the accuracy requirements from temperature sensors 410 to be significantly relaxed. This further allows for the addition of multiple active devices, e.g., IoT devices, to enable the onset of oscillation. Some active devices, such as transistors, have much larger temperature dependency then metal inductors and capacitors, and are thus limited in their accuracy in real world applications when implemented in non-temperature static environment.

An inlay-based inductor provides a quality factor which is significantly higher than that of an integrated (in-chip) inductor. Additionally, because the inductor can be placed within the inlay rather than directly on the chip, a smaller chip can used, and is thus more cost effective. In an embodiment, the LC oscillator is calibrated based on a determined temperature. Thus, based on a current temperature reading, e.g., from a temperature sensor, the frequency of the oscillator is calibrated.

In an embodiment, a reverse process may be implemented, where an LC oscillator produces a predictable temperature-to-frequency dependency so that a temperature can be determined based on a measurement of the LC oscillator frequency. If the ambient temperature changes, the temperature can be derived from an LC oscillator measurement based on the look-up table 420. Thus, the LC oscillator may function as an accurate temperature sensor. The capacitor of the LC oscillator may further be adjusted store a lower amount of electrical energy, which enhances the temperature sensitivity when used as a temperature sensor, as the overall power consumption is reduced. Adjusting the capacitor additionally ensures avoidance from interfering signals, e.g., that can cause pulling, or avoidance of spectral emissions, e.g., for regulatory purposes.

Various IoT devices may implement such an oscillator, and thus based on the frequency of an LC oscillator integral to the IoT device, a temperature of the IoT device can be determined without an additional temperature sensor.

Such a configuration allows for an oscillator that has a low dependency on the look-up table on the fabrication process, e.g., on the transistors on a chip, for proper calibration. In an embodiment, any transistors connected to the oscillator, e.g., through a chip of an IoT device, have a reduced effect on the oscillator frequency over temperature behavior, when the oscillator possesses a sufficiently high quality (Q) factor. An LC oscillator that is stable in frequency versus temperature will provide superior output reference signals.

FIG. 5 is an example graph 500 showing plots 510 of frequencies 520 as a function of ambient temperatures 530 for multiple oscillators, representing extreme manufacturing variations. As can be seen, the plots are significantly parallel and may be aligned by using a single calibration adjustment. A predetermined plot graphing frequency as a function of temperature can then be used for each of the oscillators.

It should be empathized that at production the LC oscillator is not brought to an accurate frequency. Rather, at production, various calibration frequencies are measured and saved, e.g., within a look-up table, where such frequencies can be later utilized for a recurring calibration as discussed herein, for example, in FIG. 6.

Figure 6:
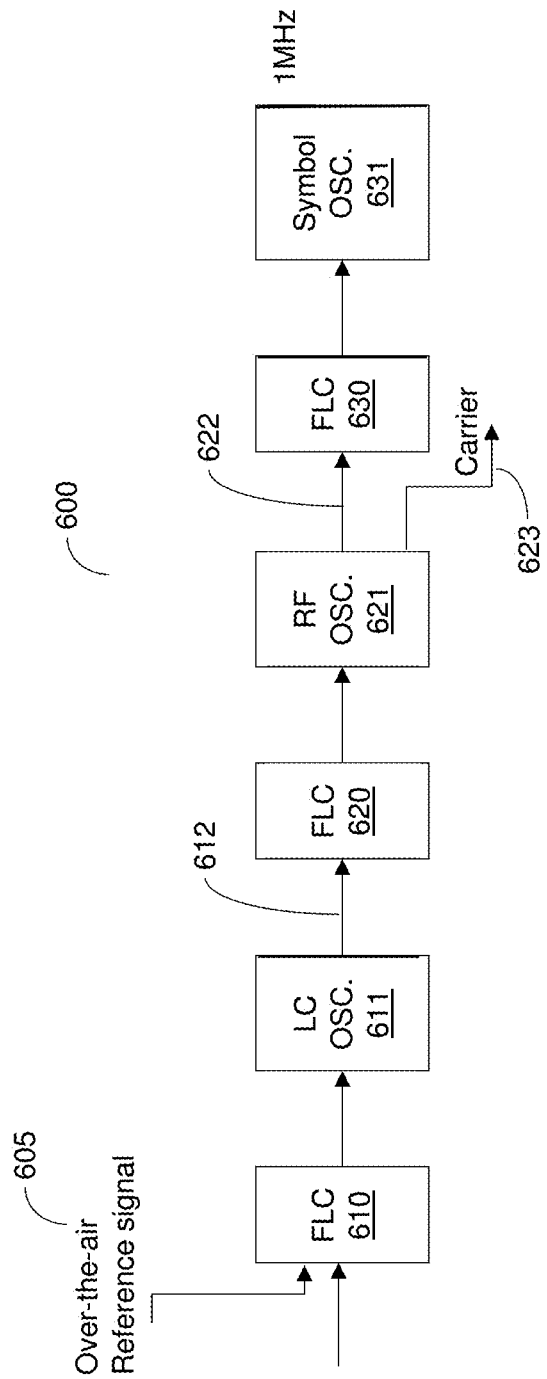
FIG. 6 is a block diagram of an oscillator calibration circuit designed according to an embodiment.

FIG. 6 shows an example oscillator calibration circuit 600 designed according to an embodiment. In this example embodiment, the oscillator calibration circuit 600 includes three frequency locking circuits (FLCs) 610, 620, and 630 respectively calibrating oscillators 611, 621, and 631. In an embodiment, one or more of these oscillators are LC oscillators, e.g., the LC oscillator discussed in FIG. 2. In this configuration, the calibration is performed sequentially. In a preferred embodiment, the oscillator 611 is an auxiliary oscillator realized as an LC oscillator and the oscillators 621 and 631 are realized as ring oscillators.

Specifically, the FLC 610 calibrates an LC oscillator 611 using an over-the-air reference signal 605. The signal 605 may be any of a variety of over-the-air reference signals. For example, such a reference signal may be a BLE advertisement packet signal, an ultra-wideband (UWB) RFID reader signal in the 900 MHz bands, a 13.56 MHz RFID reader signal, a single tone reference at any of the industrial, scientific and medical (ISM) bands, a modulated reference at any of the ISM bands, an RF signal in the Wi-Fi spectrum (2.4 GHz or 5 GHz bands), an FM radio signal, a terrestrial TV signal, and cellular. In an embodiment, the LC oscillator 611 is calibrated to output an LC signal 612 having a frequency of 1 MHz. In an embodiment, the oscillator calibration circuit 600 includes a signal frequency detector for producing a reference signal based on a received over-the-air signal, wherein the signal frequency detector is configured to detect a frequency of the over-the-air signal.

The output signal 612 serves as a reference signal to the FLC 620 which calibrates the oscillator 621. According to one embodiment, the oscillator 621 can be calibrated to output a single point carrier frequency or two points carrier frequencies. Here, the output of the oscillator 621 may serve both as a carrier signal 623 for the BLE transmitter and as a reference signal 622 for the FLC 630. The FLC 630 calibrates a symbol oscillator 631 to output a symbol signal having a frequency of 1 MHz. The symbol signal is utilized to modulate the data to be transmitted.

Each of the FLCs 610, 620, and 630 can modulate the signal to varying degrees. In this embodiment, the calibration is performed immediately prior to a transmission session, while the transmission of all FLCs and oscillators are free running. To this end, each of the FLCs 610, 620 and 630 are enabled immediately prior to a transmission session.

It should be appreciated that the oscillator calibration circuit 600 demonstrates high frequency accuracy and low power consumption. This is because the oscillator 621 and symbol oscillator 631 are calibrated using an available high frequency accurate signal over the air reference, such as 2.4 GHz, and via the high quality (auxiliary) reference oscillator. As such, the calibration time is short, which results in less energy consumption.

The utilization of the LC oscillator allows for overcoming frequency pulling. This phenomenon occurs when the reference signal utilized to calibrate the local oscillator is received through the same antenna utilized to transit the carrier signal (generated by the local oscillator). Frequency pulling typically changes the oscillating frequency. By adding another calibration stage, through the LC oscillator, the reception of the reference signal is decoupled from the transmission of the carrier signal.

It should be noted that the oscillator calibration circuit 600 can be configured in another arrangement. For example, the FLC 610 could be utilized for calibration of both FLCs 620 and 630.

It should be further noted that the oscillator calibration circuits 600, designed according to the disclosed embodiments, do not include any explicit discrete or assembled resonator component, such as a crystal resonator, a quartz resonator, or a MEMS-based resonator.

In an embodiment, the LC oscillator is calibrated according to methods discussed in U.S. patent application Ser. No. 15/994,388, now pending and assigned to the common assignee, which is hereby incorporated by reference.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. An inductor-capacitor (LC) oscillator, comprising:
   a single layer inductor disposed within a single layer inlay, wherein the single layer inductor is configured in a spiral pattern within the layer of the inlay, wherein an integrated circuit is mounted on the single layer inlay; and
   a capacitor included in the integrated circuit, wherein the capacitor is connected to the single layer inductor;
   wherein a frequency of a signal of the oscillator is measured using a signal received through at least one antenna.

2. The LC oscillator of claim 1, wherein the single layer inductor is configured to use the integrated circuit as a via to generate multiple turns to create an inductor coil of the single layer inductor.

3. The LC oscillator of claim 1, wherein, during production of the LC oscillator, at least one frequency of the LC oscillator is measured respective of an ambient temperature value.

4. The LC oscillator of claim 3, wherein a set of frequencies of the LC oscillator and respective temperature values are saved in a look-up table.

5. The LC oscillator of claim 4, wherein during operation a frequency of the LC is derived based a frequency measured during production and information saved in the look-up table.

6. The LC oscillator of claim 4, wherein the LC oscillator is calibrated based on an ambient temperature, values in the look-up table and a previously determined and calibrated LC relative frequency.

7. The LC oscillator of claim 1, wherein the LC oscillator is further connected to the at least one antenna through the integrated circuit.

8. The LC oscillator of claim 1, wherein the measured frequency of the LC oscillator is a relative frequency code.

9. The LC oscillator of claim 8, wherein an ambient temperature at the LC oscillator is determined based on the LC relative frequency code.

10. The LC oscillator of claim 1, wherein the capacitor is a dedicated capacitor included in the integrated circuit, wherein the dedicated capacitor is a configurable low temperature-sensitivity capacitor.

11. The LC oscillator of claim 1, wherein the capacitor includes parasitic capacitance from circuits included in the integrated circuit, wherein a dedicated capacitor is connected in parallel to the parasitic capacitance.

12. The LC oscillator of claim 1, wherein the capacitor is adjusted to store a lower amount of electrical energy and increase a temperature sensitivity of the LC oscillator.

* * * * *